(12) United States Patent
Adachi et al.

(10) Patent No.: US 7,830,086 B2
(45) Date of Patent: Nov. 9, 2010

(54) LIGHT EMITTING DEVICE, LIGHTING DEVICE, AND DISPLAY DEVICE HAVING LIGHT EMITTING DEVICE

(75) Inventors: Masaya Adachi, Hitachi (JP); Hajime Murakami, Tomobe (JP)

(73) Assignee: Hitachi, Ltd., Tokyo (JP)

( * ) Notice: Subject to any disclaimer, the term of this patent is extended or adjusted under 35 U.S.C. 154(b) by 907 days.

(21) Appl. No.: 11/059,351

(22) Filed: Feb. 17, 2005

(65) Prior Publication Data
US 2006/0125387 A1 Jun. 15, 2006

(30) Foreign Application Priority Data
Dec. 9, 2004 (JP) .............................. 2004-356145

(51) Int. Cl.
*H01J 1/62* (2006.01)
*H01J 63/04* (2006.01)
(52) U.S. Cl. ..................... 313/506; 313/498; 313/503; 313/504; 313/505
(58) Field of Classification Search ......... 313/503–506, 313/498
See application file for complete search history.

(56) References Cited

U.S. PATENT DOCUMENTS

| 6,965,197 | B2* | 11/2005 | Tyan et al. ................. 313/506 |
| 2002/0011783 | A1* | 1/2002 | Hosokawa ................. 313/504 |
| 2002/0094452 | A1* | 7/2002 | Ueda et al. ................. 428/690 |
| 2005/0007000 | A1* | 1/2005 | Chou et al. ................. 313/116 |
| 2005/0142379 | A1* | 6/2005 | Juni et al. ................. 428/690 |
| 2005/0194896 | A1 | 9/2005 | Sugita et al. |
| 2005/0212003 | A1 | 9/2005 | Murakami et al. |

FOREIGN PATENT DOCUMENTS

JP 2002-015859 1/2002

\* cited by examiner

*Primary Examiner*—Nimeshkumar D Patel
*Assistant Examiner*—Thomas A Hollweg
(74) *Attorney, Agent, or Firm*—Antonelli, Terry, Stout & Kraus, LLP.

(57) ABSTRACT

A light emitting device includes an organic light emitting layer disposed on a substrate and first and second electrodes between which the organic light emitting layer is disposed on the substrate. The second electrode is formed on the opposite side to the substrate of the organic light emitting layer. A buffer layer is disposed between the second electrode and the organic light emitting layer and is mainly made of oxide having a smaller quantity of oxygen generated in decomposition upon formation of the buffer layer than that of oxygen generated in decomposition upon formation of the second electrode. Further, the substrate is made of metal.

18 Claims, 9 Drawing Sheets

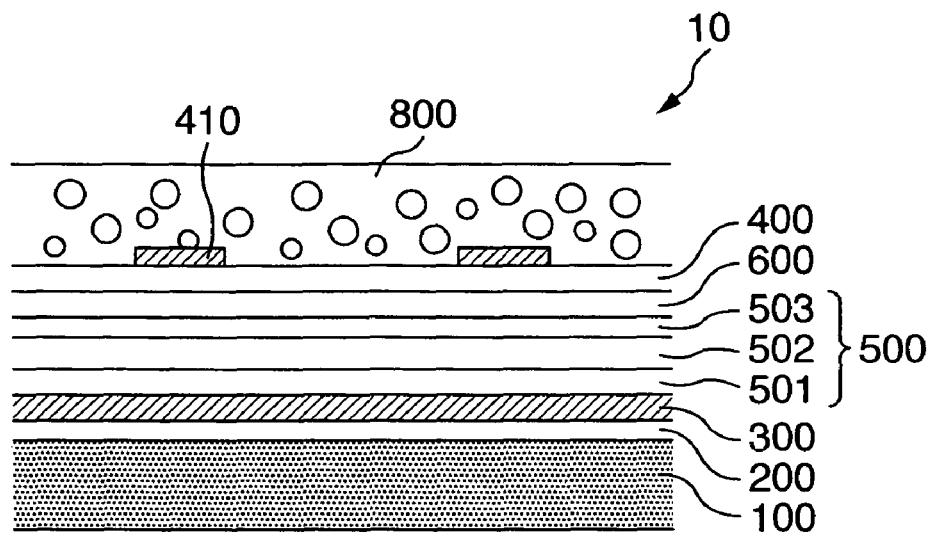
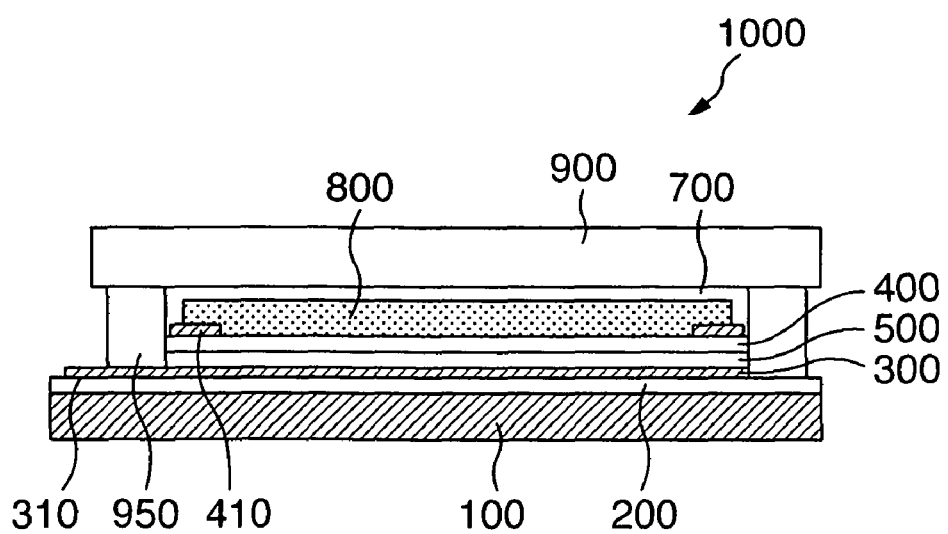

LIGHT EMITTING DEVICE, LIGHTING DEVICE, AND DISPLAY DEVICE HAVING LIGHT EMITTING DEVICE

BACKGROUND OF THE INVENTION

The present invention relates to a light emitting device including first and second electrode layers and a light emitting layer disposed therebetween, a lighting device including the light emitting device as a light source and a display device.

A light emitting device including a light emitting layer disposed between two electrodes can be made thin and is accordingly applied to a display device using the light emitting devices as pixels and a plate-like or sheet-like lighting device. Such a light emitting device uses inorganic or organic material as material of the light emitting layer. As the light emitting device using inorganic material as the light emitting layer, there are an electro-luminescence device and a light emitting diode device. Further, the light emitting device using organic material as the light emitting layer is named an organic electro-luminescence device or an organic light emitting diode device.

The organic light emitting diode device can be made to have a large area of the light emitting layer relatively easily by vapor deposition or using an ink jet method or a transfer printing method and can be operated at a low voltage. Accordingly, it is suitable for a thin and plate-like or sheet-like lighting device, particularly the backlight of a liquid crystal display device or the like.

These light emitting devices convert electric energy into light and since electric energy that does not contribute to emission of light is converted into heat, temperature of the light emitting device is raised during lighting.

The light emitting device has the problem that the life time thereof may shortened due to deterioration of the device in higher temperature or the light emission efficiency thereof is reduced. When the light emitting device is utilized as a light source of a lighting device, the lighting time thereof tends to be longer as compared with the case where the light emitting devices are utilized as pixels of a display device. Accordingly, the problem caused by the raised temperature of the light emitting device is apt to occur in the light emitting device.

In order to suppress the problem caused by the raised temperature of the light emitting device, it is preferable to dissipate the heat generated by the light emitting device as effectively as possible. To this end, it is preferable to select material having the high thermal conductivity as a substrate on which the light emitting device is formed.

As glass forming the substrate having the high thermal conductivity, there is sapphire glass, while it is preferable to use a substrate made of graphite or metal in order to realize the higher thermal conductivity. However, the substrate made of graphite or metal is generally opaque to visible light. When the substrate made of such opaque material is used, it is necessary to construct the light emitting device in which light is taken out from the opposite side to the substrate on which the light emitting device is formed, in order to utilize the light emitted from the light emitting device effectively. Such structure is named light out-coupling from top structure and the light emitting device having the light out-coupling from top structure is named a top emission type light emitting device.

An organic electro-luminescence device having the top emission type light emitting device formed on a metal substrate is disclosed in JP-A-2002-15859.

SUMMARY OF THE INVENTION

The above publication JP-A-2002-15859 describes the organic electro-luminescence device having the top emission type light emitting device formed on the metal substrate. However, this publication does not sufficiently disclose an optimum device structure for improving the light out-coupling efficiency and lengthening the life of the light emitting device using the metal substrate. Further, this publication does not also disclose the structure in which this device is used as the backlight of a display device.

It is an object of the present invention to provide optimum device structure to an organic light emitting diode device using a metal substrate as a substrate on which a light emitting device is formed and optimum structure to a display device using the light emitting device.

In order to achieve the above object, the present invention adopts the following structure, for example.

A light emitting device includes an organic light emitting layer disposed on a substrate and first and second electrodes between which the organic light emitting layer is disposed on the substrate. The first electrode is formed on the side of the substrate of the organic light emitting layer and the second electrode is formed on the opposite side to the substrate of the organic light emitting layer. A buffer layer is disposed between the second electrode and the organic light emitting layer and is made of, as main component, oxide having a smaller quantity of oxygen generated in decomposition upon formation of the buffer layer than that of oxygen generated in decomposition upon formation of the second electrode. The substrate is made of metal.

At this time, it is preferable that the second electrode is made of oxide containing indium oxide as main component and the buffer layer is made of material containing vanadium oxide as main component.

In this case, the second electrode constituting the electrode on the light out-coupling side is made of oxide containing, as main material, indium oxide having the high transmission factor and a small electric resistance and the highly efficient light emitting device having a low voltage required for emission of light can be realized since oxidation of the organic film (organic light emitting layer) in the forming process of the layer can be reduced.

Further, the realization of the highly efficient light emitting device of the top emission type can adopt the opaque metal substrate having the high thermal conductivity as the substrate on which the light emitting device is formed and since reduction of the light emission efficiency and deterioration of the device due to the increased temperature of the light emitting device can be suppressed, the light emitting device having longer lifetime can be realized.

Moreover, the light emitting device includes an organic light emitting layer disposed on a substrate and first and second electrodes between which the organic light emitting layer is disposed on the substrate. The first electrode is formed on the side of the substrate of the organic light emitting layer. The second electrode is transmissible to visible light and formed on the opposite side to the substrate of the organic light emitting layer. The substrate is made of metal. A convex portion is formed on the side where the organic light emitting layer is formed, of the substrate at periphery of an area where the organic light emitting layer is formed.

In this case, since the convex portion formed on the metal substrate functions as a spacer between the metal substrate and a sealing plate, it is not necessary to use glass having a depression formed in the middle and to provide a spacer member separately as the sealing plate. That is, an inexpensive glass plate can be utilized without a spacer as the sealing plate and accordingly the more inexpensive light emitting device can be realized.

Further, the convex portion formed on the metal substrate functions even as a rib for supplementing lack of the rigidity when the thin metal substrate is used and accordingly, it is easy to handle the substrate upon manufacturing, for example.

A display device includes a display panel for forming image by controlling a transmission factor of light coming from at least the back thereof and a lighting device disposed at the back of the display panel. The display panel includes a transparent substrate having the light transmission characteristic. The lighting device is constituted by a light emitting device including an organic light emitting layer disposed on a substrate and first and second electrodes between which the organic light emitting layer is disposed on the substrate. The first electrode is formed on the side of the substrate of the organic light emitting layer and the second electrode is transmissible to visible light and is formed on the light out-coupling side corresponding to the opposite side to the substrate of the light emitting layer. Further, a light scattering layer is disposed on the light out-coupling side of the light emitting layer and has an average refractive index smaller than that of the light emitting layer. The substrate on which the light emitting layer is formed is bonded to the transparent substrate of the display panel so that vacant space is formed between the light scattering layer and the transparent substrate of the display panel.

In this case, by disposing the light scattering layer on the light out-coupling side of the light emitting layer, the light out-coupling efficiency can be improved and change in brightness and color dependent on the viewing angle caused by the interference can be suppressed. Further, by forming the vacant space between the light scattering layer and the transparent substrate of the display panel, light emitted from the light emitting layer and passing through the light scattering layer is not transmitted within the transparent substrate constituting the display panel, so that the light is not emitted outside from an unintended area and the image quality is not deteriorated. Furthermore, since the transparent substrate of the display panel is used as the sealing plate for preventing deterioration of the light emitting device, the thinner and lighter display device can be realized.

Other structure except the foregoing will be made clear by the following description.

According to the present invention, in the organic light emitting diode device using the metal substrate as the substrate on which the light emitting device is formed, the optimum device structure having the high light out-coupling efficiency and the display device using the light emitting device can be realized.

Other objects, features and advantages of the invention will become apparent from the following description of the embodiments of the invention taken in conjunction with the accompanying drawings.

BRIEF DESCRIPTION OF THE DRAWINGS

FIG. 5 is a sectional view illustrating a light emitting device according to a third embodiment of the present invention;

FIG. 6 is a sectional view illustrating a lighting device according to a fourth embodiment of the present invention;

DESCRIPTION OF THE EMBODIMENTS

Embodiments of the present invention are now described with reference to the accompanying drawings.

Embodiment 1

Figure 1:
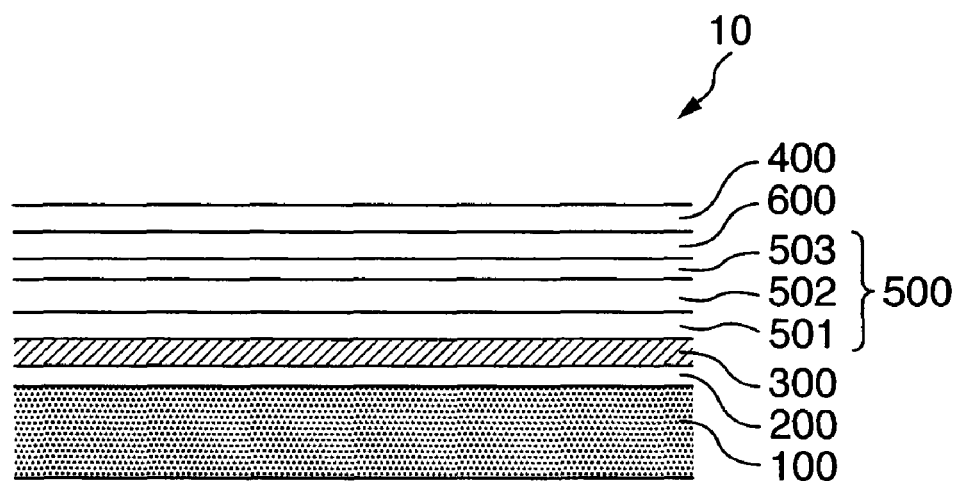
FIG. 1 is a sectional view illustrating a light emitting device according to a first embodiment of the present invention.

FIG. 1 is a partially sectional view illustrating an embodiment of a light emitting device according to the present invention. In this specification, for convenience, a device including a light emitting device layer disposed between two electrode layers on a substrate is named a light emitting device and the light emitting device including sealing means described later is named a lighting device.

In the embodiment, the structure of the light emitting device including a buffer layer disposed between a light emitting layer and a transparent electrode is described.

In the top emission type organic light emitting diode device, in order to utilize light emitted from the light emitting layer effectively, it is preferable to form the transparent electrode having the light transmission characteristic on the light out-coupling side of an organic film or layer containing the light emitting layer and an oxide containing indium oxide as main material is preferable as the transparent electrode material. However, in this case, there occurs the problem that the organic film is oxidized when the electrode is formed on the organic film and the voltage required for emission of light is increased.

The structure of a device that can solve this problem is now described.

The light emitting device 10 of the embodiment includes a metal substrate 100, an insulating layer 200 formed on at least one side of the metal substrate, first and second electrodes 300 and 400 disposed on the metal substrate 100, organic light emitting layer 500 disposed between the two electrodes and composed of a plurality of layers containing the light emitting layer, and a buffer layer 600 formed between the organic light emitting layer 500 and the second electrode 400.

The metal substrate 100 can be made of, for example, iron, nickel, aluminum, copper, chromium, magnesium, manganese, molybdenum, titanium, cobalt and alloy constituted by these metals.

It is preferable to select material having the thermal expansion coefficient (linear expansion coefficient) substantially similar to that of a sealing member described later as material of the metal substrate in order to prevent a warp of the metal substrate due to difference of the thermal expansion coefficient between the sealing member and the metal substrate.

When the sealing member is made of, for example, glass, an alloy named inver containing iron and nickel as main components, more particularly, an alloy generally named 42 alloy (Fe-42% Ni) having the nickel content of 41 to 43% or 42 alloy of which the nickel content is partially replaced by cobalt may be used as material of the metal substrate.

Further, it is preferable to make the thickness of the metal substrate thinner than or equal to 0.2 mm in order to thin and lighten the light emitting device and the lighting device and the display device having the light emitting device.

The insulating layer 200 is formed on the metal substrate 100. The insulating layer 200 is formed so as to prevent a short circuit between the metal substrate 100 and the first electrode 300 formed on the metal substrate 100. The insulating layer 200 may be made of inorganic material such as oxide such as $SiO_2$ and $Al_2O_3$ and nitride such as SiN and AlN or organic material such as acrylic resin, benzocyclobutene resin and polyimide resin.

Since the organic material has the tendency that water is contained therein and the water is apt to cause deterioration of the light emitting device, it is preferable that the insulating layer 200 is made of inorganic material. However, in order to prevent defects caused by minute projections on the surface of the metal substrate 100 from being formed, it is preferable that the insulating layer is made of organic material that can smooth uneven structure relatively easily by application when the smoothing function for covering the projections on the surface of the metal substrate is given to the insulating layer 200.

Accordingly, the insulating layer 200 may be the laminated structure of a layer made of organic material for smoothing the surface of the metal substrate and a layer made of inorganic material.

The first electrode 300, the organic light emitting layer 500 composed of a plurality of layers containing the light emitting layer and the second electrode 400 are disposed or piled on the insulating layer 200 into the laminated structure. The light emitting device according to the present invention is the so-called top-emission type light emitting device. in which light is taken out from the opposite side to the substrate on which the light emitting layer is formed, of the light emitting layer. In the embodiment, an organic light emitting diode device including the second electrode formed on the opposite side to the substrate of the organic light emitting layer 500, that is, on the light out-coupling side of the organic light emitting layer and functioning as an anode and the first electrode functioning as a cathode is described particularly.

The first electrode 300 functioning as a cathode may be made of an alloy of Al, Mg, Mg—Ag alloy or Al—Li alloy having the low work function. Since the simple substance of Al has a high driving voltage and the life is short, a very thin Li compound (such as lithium oxide $Li_2O$ and lithium fluoride LiF) may be disposed between the organic light emitting layer 500 and the first electrode so as to attain the characteristic equal to the Al—Li alloy. Further, the portion of the organic light emitting layer being in contact with the cathode may be doped with metal having quick reactivity such as lithium or strontium so as to reduce the driving voltage. Moreover, it is preferable from the viewpoint of improvement of the utilization efficiency of light emitted from the organic light emitting layer 500 that the first electrode 300 is made of material having the high reflexibility.

The organic light emitting layer 500 is made of material that emits light in desired color by applying a predetermined voltage between the second electrode 400 and the first electrode 300 to conduct a current. The organic light emitting layer 500 can use the laminated structure of an electron transporting layer 501, a light emitting layer 502 and a hole transporting layer 503 disposed in this order from the side of the cathode (first electrode 300) as shown in FIG. 1, for example. Alternatively, the light emitting layer constituting the organic light emitting layer 500 may use material that can be used for the electron transporting layer. Alternatively, a hole injection layer may be disposed between the anode and the hole transporting layer. In any event, in the present invention, the organic light emitting layer is not limited to the above-mentioned structure.

In such an organic light emitting diode device, when a DC voltage is applied between the second electrode 400 constituting the anode and the first electrode 300 constituting the cathode, holes injected from the second electrode 400 move through the hole transporting layer to reach the light emitting layer and electrons injected from the first electrode 300 move through the electron transporting layer to reach the light emitting layer so that the electrons and the holes are recombined to emit light having a predetermined wavelength from the light emitting layer.

The electron transporting layer 501 may be made of, for example, tris(8-quinolinolate)aluminum (hereinafter referred to as Alq3). Further, the hole transporting layer 503 may be made of 4,4'-bis[N-(1-naphthyl)-N-phenylamino]biphenyl (hereinafter referred to as α-NPD) or triphenyldiamine derivatives TPD (N, N'-bis(3-methylphenyl)-N,N'-diphenyl-[1,1'-biphenyl]-4,4'-diamine).

The light emitting layer 502 may be made of material that emits light in desired color, although it is preferable that it emits white light when the light emitting device is utilized as a light source of a lighting device such as backlight.

As the organic light emitting layer that emits white light, there are a structure that a plurality of light emitting layers having different luminescent colors are formed into a lamination and a structure that coloring matters having different luminescent colors are doped into one light emitting layer.

As an example of the former structure, TPD, Alq3 and 1,2,4-triazole derivatives (TAZ) are combined togher and the Alq3 is partially doped with Nile-Red. Furthermore, in the latter structure, three kinds of coloring matters, for example, 1,1,4,4-tetraphenyl-1,3-butadiene (TPB), coumarin 6, and DCM 1 may be doped into PVK (poly(N-vinylcarbazole).

In the present invention, the organic light emitting layer is not limited to the above structure. Further, the material of the organic light emitting layer is not limited to low molecular material, high molecular material, fluorescent material or phosphorescent material. That is, the organic light emitting layer that emits white light may be made of material having the increased light emission efficiency and long-life emission of white light.

The buffer layer 600 and the second electrode 400 are disposed or piled in this order on the light out-coupling side of the organic light emitting layer 500. The second electrode 400 may be made of transparent electrode material having the high work function. As such electrode material, oxide containing, as main material, indium oxide such as, for example, indium-zinc-oxide (also referred to as IZO) and indium-tin-oxide (also referred to as ITO) may be used. Since such material has a relatively low electric resistance and high transparency, it is advantageous to realize the light emitting device having the high efficiency. Particularly, it is preferable that the second electrode may be made of electrode material such as $In_2O_3$—$SnO_2$, $In_2O_3$—$ZnO$ or the like.

When the second electrode 400 is made of electrode material containing the indium oxide as a main material as described above, the buffer layer 600 is desirably made of material containing, as a main component, conductive oxide having the stronger oxygen bonding power than that of the second electrode. The first feature of the present invention resides in the buffer layer 600. As such material, there is material containing vanadium oxide, molybdenum oxide, tungsten oxide, tantalum oxide, titanium oxide, niobium oxide, chromium oxide or the like as a main component.

When the second electrode 400 is made of indium-zinc-oxide, material containing, as a main component, molybdenum oxide or tungsten oxide having Gibbs free energy generated near the melting point smaller than −300 KJ/mol can be used to realize the light emitting device having small deterioration and high efficiency. Particularly, when vanadium oxide having the Gibbs free energy generated near the melting point that is as small as 1100 KJ/mol is used, the light emitting device having the high efficiency can be realized.

Further, it is preferable that the thickness of the buffer layer 600 is 5 to 50 nm. This reason is that when the thickness of the buffer layer 600 is thinner than 5 nm, oxidation of the organic light emitting layer cannot be suppressed sufficiently and when it is thicker than 50 nm, reduction of the brightness due to the reduced light transmission characteristic of the buffer layer 600 cannot be neglected.

Moreover, a protection layer not shown may be disposed on the second electrode 400. The protection layer is to prevent $H_2O$ and $O_2$ in the air from entering the electrode and the organic light emitting layer.

The protection layer may be made of transparent inorganic material such as SiOx, SiNx and SiOxNy or transparent organic high-molecular material such as polypropylene and polyethylene terephthalate, although it is not limited thereto.

Figure 2:
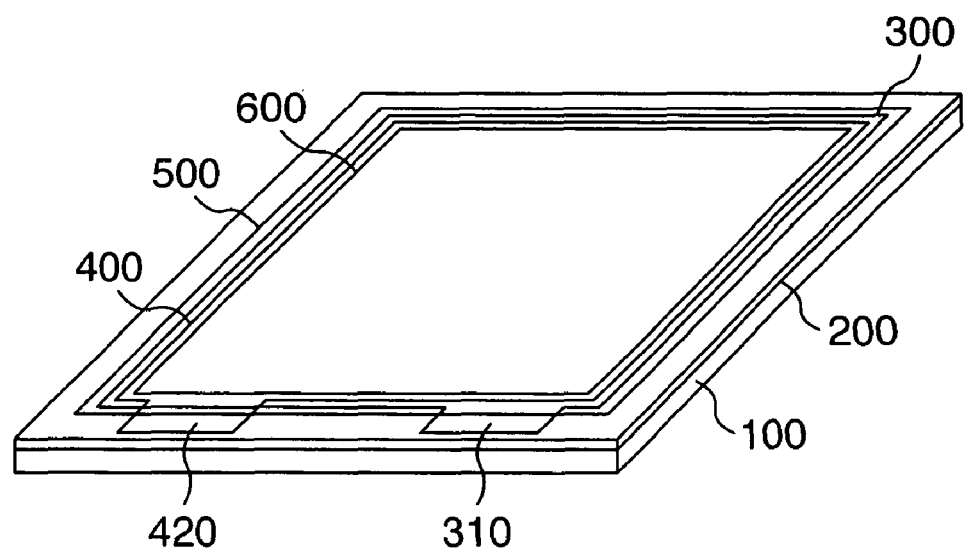
FIG. 2 is a perspective view illustrating the light emitting diode of FIG. 1.

FIG. 2 is a perspective view illustrating the light emitting device having the layer structure described with reference to FIG. 1. The light emitting device includes, as described above, the first electrode 300, the organic light emitting layer 500, the buffer layer 600 and the second electrode 400 formed in the laminated manner in this order on the surface of the metal substrate 100 on which the insulating layer 200 is formed. All of these electrodes and layers can be formed into a desired shape by vapor deposition through a shadow mask selectively.

The first electrode 300 is formed to have a tab portion 310 formed at a portion, as a minimum, on the outside of a light emitting area defined when the light emitting device is formed.

The organic light emitting layer 500 is formed to cover the first electrode 300 except the tab portion 310 of the first electrode 300.

The buffer layer 600 is formed in an area smaller than the area in which the organic light emitting layer 500 is formed so that the buffer layer 600 does not come into contact with the first electrode 300.

The second electrode 400 is formed to have a pulling-out portion 420 formed at a portion, as a minimum, on the outside of the light emitting area defined when the light emitting device is formed. At this time, the second electrode 400 is formed in an area smaller than the area in which the organic light emitting layer 500 is formed except the tab portion 420 so that the second electrode 400 does not come into contact with the first electrode 300.

The tab portion 310 of the first electrode 300 and the tab portion 420 of the second electrode 400 are connected to wiring members such as flexible printed wiring boards (FPC) not shown and the wiring members are connected to switches and the like, so that a plate-like or sheet-like light emitting device which can be controlled to be turned on and off can be realized.

The shape and the number of the tab portions of the first and second electrodes are not limited to those of the embodiment.

In the light emitting device of the embodiment, the second electrode on the light out-coupling side is made of oxide containing indium oxide having the high transmission factor and a small electric resistance as main material. Further, the buffer layer 600 made of material having the generated Gibbs energy near the melting point smaller than that of the second electrode is disposed between the organic light emitting layer 500 and the. second electrode 400, so that oxidation of the organic light emitting layer 500 in the layer forming process can be suppressed and the highly efficient light emitting device having a low voltage required for emission of light can be realized. Particularly, by using vanadium oxide as the buffer layer 600, more efficient light emitting device can be realized.

As described above, when the light emitting device uses a substrate made of metal, the substrate is opaque and accordingly the light emitting device is required to be the top emission type. Therefore, the realization of the highly efficient light emitting device of the top emission type as shown in the embodiment can adopt the metal substrate that is opaque but has the high thermal conductivity as the substrate on which the light emitting device is formed and since reduction of the light emission efficiency and deterioration of the device due to the raised temperature of the light emitting device can be suppressed, the highly efficient and long-life light emitting device can be realized.

Embodiment 2

Figure 3:
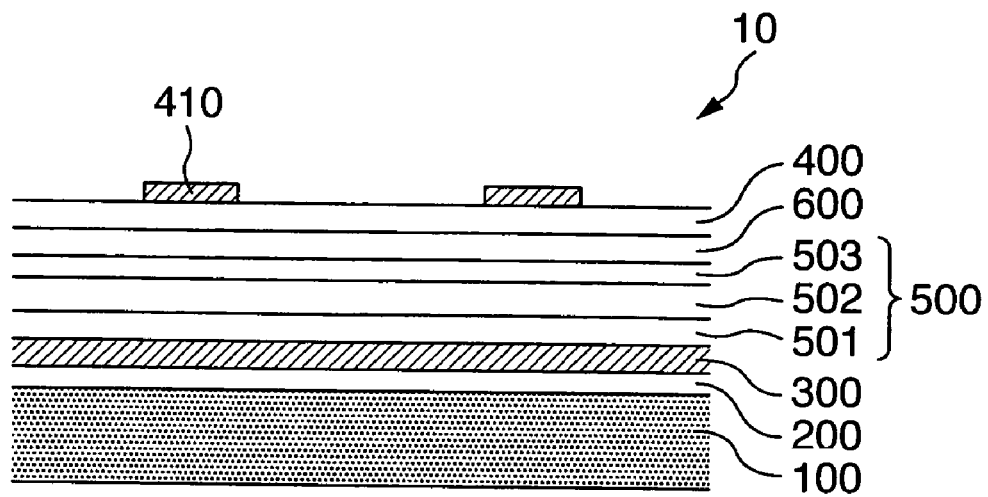
FIG. 3 is a sectional view illustrating a light emitting device according to a second embodiment of the present invention.

Another embodiment of the light emitting device according to the present invention is now described. FIG. 3 is a partially sectional view illustrating the light emitting device according to the embodiment of the present invention. The light emitting device includes an auxiliary-electrode 410 disposed on the second electrode 400 in the light emitting device described with reference to FIGS. 1 and 2 and other structure except the auxiliary electrode 410 is basically the same as that of the first embodiment. Accordingly, the like portions or elements are designated by like reference numerals and detailed description thereof is omitted.

The second electrode is formed on the light out-coupling side of the organic light emitting layer 500 and light emitted from the organic light emitting layer 500 passes through the second electrode and goes out. Accordingly, it is preferable that the transmission factor of the second electrode is as high as possible in order to realize the bright light emitting device.

However, an electric resistance of transparent electrode material is generally higher as compared with opaque metal material such as aluminum and copper. Further, it is effective to thin down the thickness of the electrode in order to increase the transmission factor, although an electric resistance thereof is further increased in this case, Accordingly, there occurs the problem that distribution of brightness in the surface of the light emitting device is non-uniform due to a voltage drop caused by the high electric resistance of the second electrode.

The auxiliary electrode 410 constitutes means for uniforming the distribution of the brightness in the surface of the light emitting device by preventing the voltage drop in the second electrode 400.

Accordingly, it is preferable to use the material having a low electric resistance such as aluminum, copper or alloy containing such metal as the material of the auxiliary electrode 410.

Figure 4:
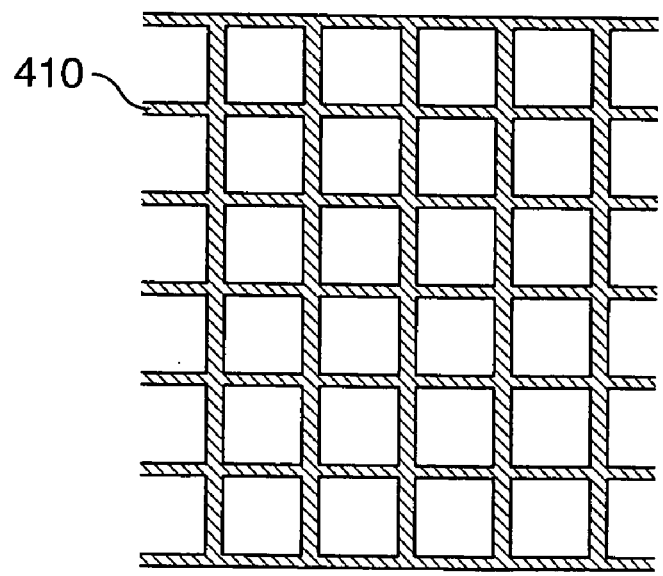
FIG. 4 is a front view illustrating an example of a formation pattern of an auxiliary electrode used in the light emitting device of FIG. 3.

FIG. 4 is a front view illustrating an example of a formation pattern of the auxiliary electrode 410. As shown in FIG. 4, the auxiliary electrode 410 may be formed into a lattice. Further, in the lighting device having a small area, the auxiliary electrode may be formed at the peripheral portion of the light emitting area of the light emitting device so that the auxiliary electrode surrounds the light emitting area.

The formation pattern of the auxiliary electrode 410 may be selected properly in accordance with the size of the light emitting device and the electric resistance of the second electrode.

The auxiliary electrode 410 can be subjected to evaporation by means of a shadow mask to be formed into a desired shape.

In the embodiment, as described above, since the provision of the auxiliary electrode on the second electrode formed on the light out-coupling side of the organic light emitting layer can suppress the voltage drop in the second electrode 400, the light emitting device having the uniform distribution of brightness in the surface can be realized.

Embodiment 3

Another embodiment of the light emitting device according to the present invention is now described.

In the embodiment, a light scattering layer is disposed on the surface of the light emitting device.

FIG. 5 is a partially sectional view illustrating the light emitting device according to the embodiment of the present invention. The light emitting device includes a light scattering layer 800 newly disposed on the second electrode 400 in the light emitting device described with reference to FIG. 3 and other structure is basically the same as that of the above embodiment. Accordingly, the like portions or elements are designated by like reference numerals and description thereof is omitted.

The light scattering layer 800 is formed on the second electrode 400 directly or through a protection layer not shown formed if necessary.

The light scattering layer 800 is provided to improve the light out-coupling efficiency and suppress change in brightness and color due to change in the viewing angle caused by the interference.

In order to increase the amount of taken-out light, it is important to reduce the refractive index as compared with the organic light emitting layer 500 containing the light emitting layer. The light scattering layer realizes the low refractive index by mixedly disposing areas having different refractive indexes and accordingly the refractive index is named an average refractive index.

It is important that the refractive index of the layer disposed between the organic light emitting layer 500 and the light scattering layer 800 is larger than the average refractive index of the light scattering layer 800 in order to improve the light out-coupling efficiency and realize the bright light emitting device. In other words, it is important that the average refractive index of the light scattering layer 800 is smaller than the refractive indexes of the organic light emitting layer 500 and the layer disposed between the organic light emitting layer 500 and the light scattering layer 800.

This reason is that if a layer having a small refractive index is disposed between the light emitting layer and the light scattering layer 800, light is totally reflected by the interface of the layer and light transmitted in the direction of the substrate 100 is increased, so that the amount of taken-out light is limited.

Accordingly, it is preferable that the light scattering layer 800 is formed in the position nearest to the organic light emitting layer 500 and any substance such as a glass substrate, having the refractive index smaller than that of the organic light emitting layer 500 is not disposed between the light scattering layer 800 and the second electrode 400.

Further, the reduced average refractive index of the light scattering layer 800 increases the amount of taken-out light. Accordingly, when it is considered that practical effect is attained as compared with the conventional light emitting device, that is, the effect matched to the increased cost due to addition of the light out-coupling layer is attained, it is necessary to make the average refractive index of the light out-coupling layer smaller than 1.5, more preferably smaller than or equal to 1.45.

The light scattering layer 800 may be made of a transparent medium which is made of the resin transparent to at least visible light and in which minute transparent substances made of corpuscles or minute particles or bubbles transparent to at least visible light and having a different refractive index are scattered.

The transparent medium may be made of photo-curing transparent resin, thermoplastic transparent resin, thermosetting transparent resin or transparent resin having the function acting as an adhesive, although it is necessary to consider that the organic layer is not damaged in the layer forming process.

A transparent protection layer not shown may be formed between the second electrode 400 and the light scattering layer 800 in order to prevent or relieve damage from being done to the light emitting device when the light scattering layer is formed. Such a protection layer may be made of silicon oxide, silicon nitride or titanium oxide. In order to further increase the amount of taken-out light, it is preferable that the refractive index of the protection layer is equal to or larger than that of the organic light emitting layer and to this end it is preferable that the protection layer is made of silicon nitride or titanium oxide.

The minute transparent substances are composed of transparent corpuscles or vacant spaces such as bubbles having the refractive index different from that of the transparent medium. As the transparent corpuscles, glass corpuscles, melamine corpuscles, styrene corpuscles, benzoguanamine corpuscles, polytetrafluoroethylene corpuscles or the like can be used. The shape thereof may be any of sphere, pea gravel shape and rectangular parallelepiped but it is preferable that the transparent corpuscles are spherical corpuscles which can scatter light isotropically.

The size of the minute transparent substance is preferably about 1 to 10 μm in order to scatter light in the wavelength range of the visible light efficiently, although it may contain the size of about several tens nm to 1 μm to scatter light in the wavelength range of the near-ultraviolet light from the standpoint that the amount of taken-out light is improved.

The light scattering layer 800 may use, as a concrete example, a transparent acrylic adhesive having the refractive index of 1.47 and in which 30 portions (weight portion number to the solid portion of adhesive) of corpuscles of benzoguanamine material having the average diameter of 2 μm and the refractive index of 1.57 are dispersed so that the light scattering layer has the thickness of 20 μm. In this case, the average refractive index of the light scattering layer is about 1.496 and is smaller than the refractive index (about 1.7) of the light emitting layer. Accordingly, the amount of taken-out light is increased as compared with the case where the light scattering layer is not provided and the brighter light emitting device can be realized for the same power consumption.

Alternatively, the light scattering layer 800 may use a transparent acrylic adhesive having the refractive index of 1.47 and in which corpuscles of polytetrafluoroethylene resin having the average diameter of 2 μm and the refractive index of 1.35 are dispersed in the volume ratio of 25% so that the light scattering layer has the thickness of 20 μm. In this case, the average refractive index of the light scattering layer 800 is 1.44 and is smaller than the refractive index (about 1.7) of the light emitting layer. Accordingly, the amount of taken-out light is increased as compared with the case where the light scattering layer is not provided and the brighter light emitting device can be realized for the same power consumption.

The refractive index of the corpuscles realizing the minute transparent substances may be larger or smaller than that of the transparent medium as described above, while it is advantageous to use the corpuscles having the refractive index smaller than that of the transparent medium in order to make smaller the average refractive index of the light scattering layer 800.

Further, it is advantageous to use vacant spaces such as bubbles as the minute transparent substances instead of the transparent corpuscles in order to realize the light scattering layer having the smaller average refractive index. The light scattering layer 800 containing the minute transparent substances of bubbles in the transparent medium can be realized by adding a foaming agent to transparent resin and generating bubbles by gas produced by decomposition of the foaming agent by heating.

Alternatively, as the minute transparent substances, hollow corpuscles having vacant spaces contained therein may be used.

The light emitting device such as an organic light emitting diode device has the laminated structure of thin films or layers having different refractive indexes and having the thickness of several tens to several hundreds nm approximately equal to or shorter than the wavelength of light. Further, since the first electrode is often formed into the mirror surface, light emitted from the organic light emitting layer is apt to be influenced by interference.

Accordingly, the usual organic light emitting diode device has the problem that the light taken out actually due to the interference has the spectrum that is changed depending on difference in its emission direction or difference in the viewing angle, so that the brightness and the color thereof are changed. Even an inorganic electro-luminescence device has the same problem.

The light emitting device of the embodiment includes the light scattering device 800 disposed on the second electrode 400. In this case, the light emitted from the organic light emitting device 500 is scattered by the light scattering device 800 so that light having various transmission directions and phase differences is mixed and accordingly there can be obtained the effect that the change in the brightness and the color due to difference in the viewing angle caused by the interference is greatly reduced.

Further, as in the embodiment, even when the auxiliary electrode 410 is formed on the second electrode 400, the light emitted from the organic light emitting device 500 is scattered by the light scattering device 800 and accordingly the light emitting device having the uniform distribution of brightness can be realized even when the auxiliary electrode 410 exists.

Therefore, according to the embodiment, there can be realized the top emission type light emitting device that improves the light out-coupling efficiency and suppresses change in the brightness and the color due to change in the viewing angle caused by the interference. Further, the metal substrate which is opaque but has the high thermal conductivity can be adopted as the substrate on which the light emitting device is formed and since reduction of the light emission efficiency due to the increased temperature of the light emitting device and deterioration of the device are suppressed, the highly efficient and long-life light emitting device can be realized.

In the light emitting device of the embodiment, since the scattering layer having the small refractive index is used as the light scattering layer 800, change in color due to the interference can be suppressed and the amount of taken-out light can be increased. That is, the brighter light emitting device in which change in the brightness and the color due to difference of the viewing angle is reduced can be obtained for the same power consumption. In other words, if the brightness is identical, the low-power light emitting device in which change in color due to difference of the angle of the visual field is reduced can be obtained.

The above effect is further increased by setting non-scattered fraction of the light scattering layer 800 within the range that it is equal to or larger than 1% and smaller than 5%.

Further, in the embodiment, the case where the auxiliary electrode 410 is provided has been described, although the effect obtained by the provision of the light scattering layer can be obtained regardless of the presence of the auxiliary electrode.

Embodiment 4

An embodiment of a lighting device according to the present invention is now described. FIG. 6 is a partially sectional view illustrating the lighting device according to the embodiment of the present invention. In the specification, the device including the light emitting device disposed between two electrode layers on the substrate is named the light emitting device and the light emitting device including sealing means is named the lighting device.

In the embodiment, the sealing means of the light emitting device does not include a depression disposed in the middle thereof and is formed into a plate. The plate-like sealing means is named a sealing plate.

The light emitting diode device is required to use the sealing plate having the gas barrier characteristic in order to prevent deterioration of the organic layer. Generally, the sealing plate includes a depression formed in the middle thereof and is bonded to the substrate on which the light emitting device is formed, at the peripheral portion of the sealing plate.

On the other hand, in the top emission type light emitting diode device, light emitted from the light emitting device is required to pass through the sealing plate and accordingly the sealing plate is required to be transparent. Glass is suitable for the sealing plate of the top emission type light emitting diode device since it is transparent and has the high gas barrier characteristic.

However, glass having a depression formed in the middle is expensive. Particularly, when the light scattering layer is formed on the light out-coupling side of the light emitting layer in order to improve the light out-coupling efficiency and suppress change in brightness and color due to the angle of the visual field, the thickness of the light scattering layer is as thick as several tens μm and accordingly the depression in the middle of the sealing plate is required to be equal to or larger than several tens μm, so that it is more expensive.

Accordingly, the embodiment for realizing a low-cost light emitting device using a metal substrate is now described with reference to FIG. 6.

The lighting device 1000 of the embodiment shown in FIG. 6 include a sealing plate 900 which is bonded to the metal substrate 100 of the light emitting device 10 described with reference to FIG. 5 by means of a frame-shaped spacer 950. Accordingly, the like portions or elements to those of the preceding embodiment are designated by like reference numerals and detailed description thereof is omitted.

Generally, the organic light emitting layer 500 constituting the light emitting device is apt to be deteriorated by water in the air or the like. Accordingly, it is preferable that the transparent sealing plate 900 is disposed on the light out-coupling side of the light scattering layer 800 to make hermetic seal so that the light scattering layer is not directly brought into contact with air. The sealing plate 900 may be made of glass plate, resin film subjected to gas barrier processing, a lamination of thin glass plate and resin film or the like.

The sealing plate 900 is hermetically bonded to the metal substrate 100 through the frame-shaped spacer 950 surrounding the light emitting area of the light emitting device by means of adhesive sealing agent.

Figure 7:
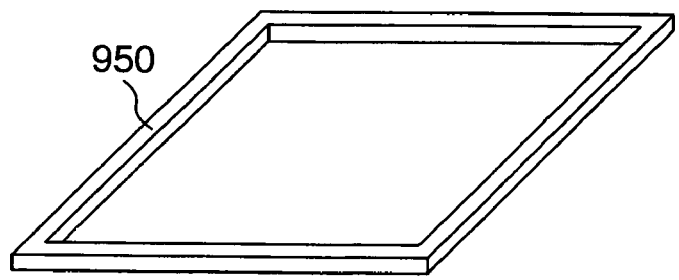
FIG. 7 is a perspective view illustrating a spacer used in the lighting device of FIG. 6.

FIG. 7 is a perspective view illustrating the spacer 950. The total thickness of the first electrode 300, the organic light emitting layer 500 and the second electrode 400 is as thin as about several hundreds nm, while the thickness of the light scattering layer is several tens μm. The spacer 950 is made thicker than the total thickness of the first electrode 300, the organic light emitting layer 500, the second electrode 400 and the light scattering layer 800, so that a vacant space 700 can be formed between the light scattering layer 800 and the sealing plate 900.

The vacant space 700 preferably contains inert gas such as nitrogen gas. In this case, the surface of the light scattering layer 800 may be formed into an uneven shape or a minute-lens array shape so that the amount of taken-out light is increased. Further, if necessary, a moisture absorbent may be disposed between the sealing plate 900 and the metal substrate 100 so that light emitted from the organic light emitting layer 500 is not disturbed or a transparent moisture-absorbent film may be applied on the side of the light scattering layer 800 of the sealing plate 900.

Further, when the light scattering layer 800 is in direct contact with the sealing plate 900 without the vacant space 700 between the light scattering layer 800 and the sealing plate 900, part of light which is emitted from the organic light emitting layer 500 and passes through the light scattering layer 800 to come into the sealing plate 900 is transmitted within the sealing plate 900 and suffers a loss during the transmission.

On the other hand, as in the embodiment, when the vacant space 700 is formed between the light scattering layer 800 and the sealing plate 900, light transmitted within the sealing plate 900 to suffer a loss is hardly produced and accordingly the brighter lighting device can be realized.

Further, since the provision of the spacer having the thickness of several tens or more μm can utilize an inexpensive plane-shaped glass plate as the sealing means, the more inexpensive lighting device can be realized. Further, by using this spacer structure, an inexpensive structure of the light emitting device using the metal substrate can be realized.

Embodiment 5

Another embodiment of the lighting device according to the present invention is now described.

Figure 8:
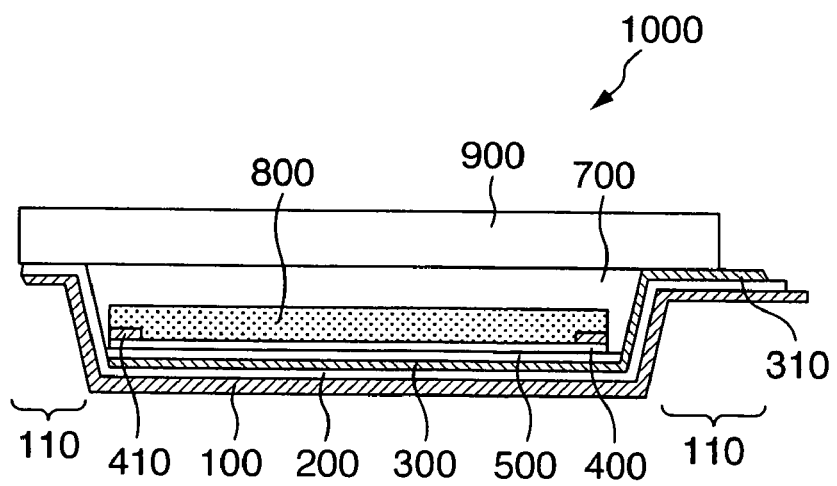
FIG. 8 is a sectional view illustrating a lighting device according to a fifth embodiment of the present invention.

FIG. 8 is a partially sectional view illustrating the lighting device of the present invention. The lighting device 1000 is different from the lighting device described with reference to FIG. 6 in that the spacer is removed and instead a convex area or portion 110 is formed at the peripheral portion of the metal substrate 100 so that the sealing plate 900 is bonded to the metal substrate as the convex area 110. Accordingly, the like portions or elements to those of the preceding embodiment are designated by like reference numerals and detailed description thereof is omitted.

In the embodiment, the metal substrate 100 includes the convex area 110 formed at the peripheral portion of the metal substrate on the side that the organic light emitting layer 500 is formed.

The sealing plate 900 is hermetically bonded to the metal substrate 100 at the convex area 110 by means of adhesive sealing agent. The convex area 110 may include a flat portion disposed at the top portion thereof and having the width of about 0.1 to 3.0 mm in order to facilitate the bonding of the sealing plate 900 to the metal substrate 100 and enhance the hermetically sealing characteristic.

Further, the height of the convex area 110 is larger than the total thickness of the first electrode 300, the organic light emitting layer 500, the second electrode 400, the buffer layer not shown and the light scattering layer 800 so that the vacant space 700 is formed between the light scattering layer 800 and the sealing plate 900.

In the case of the metal substrate, such a convex area can be formed easily by pressing a plate-shaped metal sheet.

Even in the embodiment, since the vacant space 700 is formed between the light scattering layer 800 and the sealing plate 900, light transmitted within the sealing plate 900 to suffer a loss is hardly produced and accordingly the brighter lighting device can be realized in the same manner as the preceding embodiment.

In the embodiment, by functioning the convex area formed in the metal substrate as the spacer, it is not necessary to use the glass having the depression formed in the middle as the sealing plate or dispose the spacer member separately. In other words, since the inexpensive glass plate can be utilized as the sealing plate without a spacer, the more inexpensive light emitting device can be realized. Further, by using the metal substrate structure, the light emitting device using the metal substrate can be realized with inexpensive structure.

Figure 9:
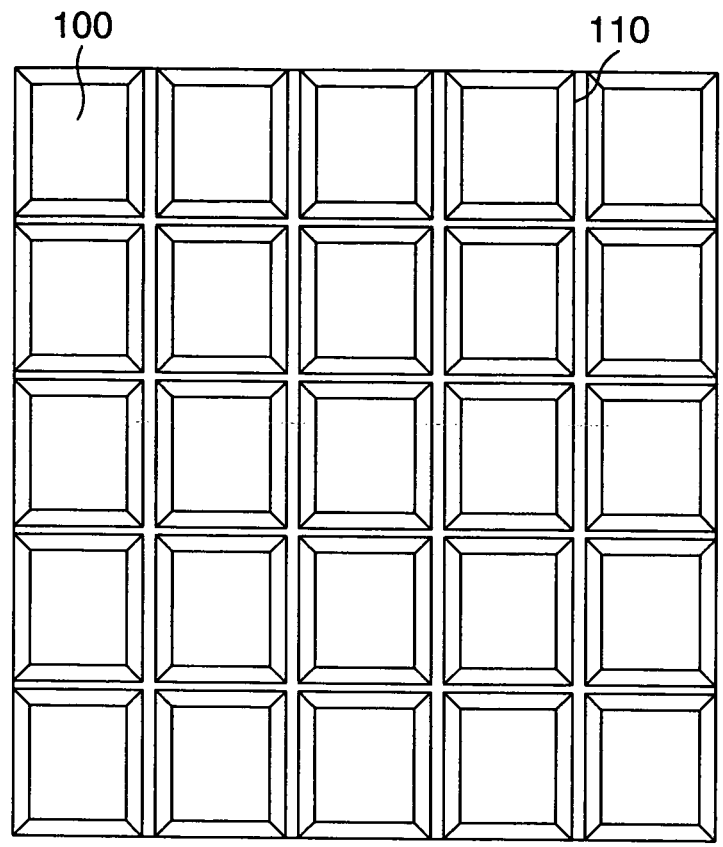
FIG. 9 is a front view illustrating a metal substrate according to the present invention.

Further, the convex portion formed in the metal substrate functions even as a rib for supplementing lack of the rigidity when the thin metal substrate is used. FIG. 9 is a plan view illustrating an example of a large-scale metal substrate formed with a lot of areas enclosed by convex portions 110 in order to enhance the productivity and in which a lot of small light emitting devices or lighting devices are to be disposed. When the large-scale metal substrate is formed with a lot of areas enclosed by convex portions 110, the convex portions formed at the periphery of divided areas of the metal substrate are formed into the mesh as shown in FIG. 9.

For example, when a thin plate-shaped metal substrate is used as it is, it is difficult to treat it since it is easily warped when it is large. However, since the metal substrate of the present invention includes the convex portions formed into the mesh on the substrate, the convex portions supplement the lack of the rigidity of the metal substrate and it is easy to handle the substrate upon manufacturing.

Embodiment 6

Figure 10:
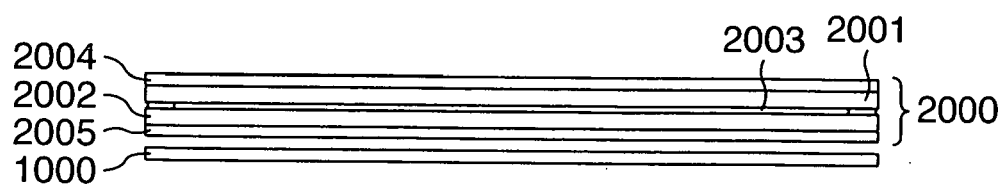
FIG. 10 is a sectional view illustrating a display device according to a sixth embodiment of the present invention.

An embodiment of a display device according to the present invention is now described. FIG. 10 is a partially sectional view illustrating the embodiment of the display device according to the present invention.

The display device includes a liquid crystal display panel 2000 and the lighting device 1000 described with reference to FIG. 6 or 8 and disposed at the back of the liquid crystal display panel 2000.

The lighting device 1000 is to light a display area of the liquid crystal display panel 2000 and the lighting device 1000 is disposed so that the sealing plate 900 thereof is opposite to the liquid crystal display panel 2000.

An optical sheet such as a prism sheet and a diffusion sheet not shown may be disposed between the lighting device 1000 and the liquid crystal display panel 2000 if necessary.

As the liquid crystal display panel 2000, a transparent type liquid crystal display panel is used. For example, TN (Twisted Nematic) system, STN (Super Twisted Nematic) system, ECB (Electrical Controlled Birefrignence) system or the like can be used. Further, VA (Vertical Alignment) system or IPS (In-Plane Switching) system characterized by the wide angle of the visual field can be used.

Alternatively, the liquid crystal display panel 2000 may use a semi-transparent reflection type liquid crystal display panel in which the above system is applied.

These liquid crystal display panels include a polarizing plate so that the polarized state of light coming into a liquid crystal layer is controlled to display an image and the image with the high contrast ratio can be obtained with a relatively small driving voltage.

The following description is made to the case where the IPS system is used as the liquid crystal display panel 2000, although the present invention is not limited thereto.

The liquid crystal display panel 2000 includes first and second transparent substrates 2001 and 2002 made of a plane, transparent and optically isotropic glass or plastic. Color film or orientation film (either not shown) made of polyimide polymer is disposed or piled on the transparent substrate 2001. Orientation film, pixel electrodes forming pixels, common electrodes, signal electrodes, scanning electrodes, switching elements such as thin-film transistors and the like (either not shown) are formed in the second transparent substrate 2002.

The two transparent substrates 2001 and 2002 are disposed so that the respective orientation-film formed sides are opposite to each other and a fixed gap is formed between the two transparent substrates by means of a spacer not shown. The periphery of the gap is bonded by means of a frame-shaped sealing member so that a space is formed therein. Liquid crystal is hermetically enclosed in the space to thereby form a liquid crystal layer 2003.

The liquid crystal layer 2003 has the orientation direction of the major axis of liquid crystal molecules aligned by orientation processing subjected to the orientation films formed on the two transparent substrates 2001 and 2002. The orientation direction of the liquid crystal layer 2003 is a so-called homogeneous orientation that is not twisted between the two transparent substrates 2001 and 2002.

Polarizing plates 2004 and 2005 are disposed at the front of the transparent substrate 2001 and at the back of the transparent substrate 2002, respectively.

As the polarizing plates 2004 and 2005, protection layers of triacetylcelluose formed on both sides of film given the polarization function by making extended polyvinylalcohol absorb iodine can be used. The polarizing plates 2004 and 2005 are bonded to the transparent substrates 2001 and 2002 by means of a transparent adhesive agent, respectively.

Light from the lighting device 1000 passes through the polarizing plate 2005 and then passes through the liquid crystal layer 2003 to come into the polarizing plate 2004. In this case, a voltage corresponding to image information supplied from an image information generator (not shown) is applied between the common electrode and the pixel electrode to thereby control a polarization state of light passing through the liquid crystal layer 2003 and adjust the amount of light passing through the polarizing plate 2004, so that desired image light can be formed.

The display device of the embodiment includes the thin and highly efficient lighting device and accordingly the thin and low power consumption display device can be realized.

Embodiment 7

Figure 11:
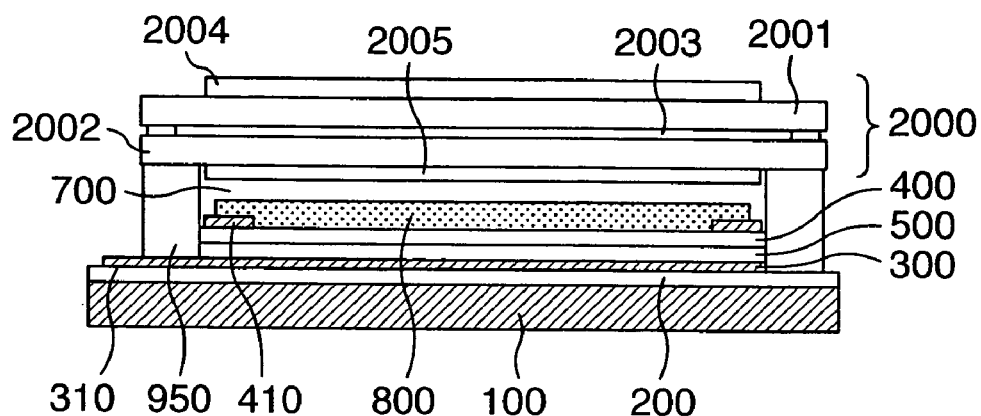
FIG. 11 is a sectional view illustrating a display device according to a seventh embodiment of the present invention.

Another embodiment of the display device according to the present invention is now described. FIG. 11 is a partially sectional view illustrating the embodiment of the display device according to the present invention.

The display device includes a liquid crystal display panel 2000 and a light emitting device disposed at the back thereof. Here, description is made to the case where the light emitting device described with reference to FIG. 5 is applied. Further, the basic structure of the liquid crystal display panel 2000 is the same as that of the display device described with reference to FIG. 10. Accordingly, the same portions or elements to those of the preceding embodiment are designated by like reference numerals and detailed description thereof is omitted.

As the liquid crystal display panel 2000, a transparent type liquid crystal display panel is used. For example, TN (Twisted Nematic) system, STN (Super Twisted Nematic) system, ECB (Electrical Controlled Birefrignence) system or the like can be used. Further, VA (Vertical Alignment) system or IPS (In-Plane Switching) system characterized by the wide angle of the visual field can be used.

Alternatively, the liquid crystal display panel 2000 can use a semi-transparent reflection type liquid crystal display panel in which the above system is applied.

The liquid crystal display panel 2000 includes a first transparent substrates 2001 made of a plane, transparent and optically isotropic glass or plastic and a second transparent substrate made of glass. Color film or orientation film (either not shown) made of polyimide polymer is disposed or piled on the transparent substrate 2001. Orientation film, pixel electrodes forming pixels, common electrodes, signal electrodes, scanning electrodes, switching elements such as thin-film transistors and the like (either not shown) are formed in the second transparent substrate 2002.

The two transparent substrates 2001 and 2002 are disposed so that the respective orientation-film formed sides are opposite to each other and a fixed gap is formed between the two transparent substrates by means of a spacer. The peripheries of the two transparent substrates are bonded by means of a frame-shaped sealing member so that a vacant space is formed therein. Liquid crystal is hermetically enclosed in the space to thereby form a liquid crystal layer 2003.

Polarizing plates 2004 and 2005 are disposed at the front of the transparent substrate 2001 and at the back of the transparent substrate 2002, respectively. As the polarizing plates 2004 and 2005, protection layers of triacetylcellulose formed on both sides of film given the polarization function by making extended polyvinylalcohol absorb iodine can be used. The polarizing plates 2004 and 2005 are bonded to the transparent substrates 2001 and 2002 by means of a transparent adhesive agent, respectively.

The light emitting device is disposed at the back of the polarizing plate 2005. Generally, the organic light emitting layer constituting the light emitting device is apt to be deteriorated by moisture in the air. Accordingly, it is preferable that the light out-coupling side of the light scattering layer 800 is hermetically sealed by a transparent sealing plate so that the organic light emitting device is not directly brought into contact with air.

In the embodiment, the second transparent substrate 2002 of the liquid crystal display panel 2000 has the function of the sealing plate.

The second transparent substrate 2002 is hermetically bonded to the metal substrate 100 through a frame-shaped spacer 950 surrounding the light emitting area of the light emitting device by means of adhesive sealing agent.

In this case, when the polarizing plate 2005 exists between the spacer 950 and the second transparent substrate 2002, there is the possibility that moisture and oxygen in the air enter into the. organic light emitting layer 500 through the polarizing plate to. thereby cause deterioration. Accordingly, as shown in FIG. 11, it is preferable that an opening of the spacer 950 is made larger than the polarizing plate 2005 so that the polarizing plate 2005 is not disposed between the spacer 950 and the second transparent plate 2002.

In this case, the spacer 950 is made thicker than the total thickness of the first electrode 300, the organic light emitting layer 500, the second electrode 400, the buffer layer not shown, the light scattering layer 800 and the polarizing plate 2005, so that the vacant spacer 700 can be formed between the light scattering layer 800 and the liquid crystal display panel 2000.

Alternatively, the surface of the polarizing plate 2005 may be subjected to the gas barrier processing. In this case, if the polarizing plate 2005 is disposed between the spacer 950 and the second transparent electrode 2002, the spacer 950 is made thicker than the total thickness of the first electrode 300, the organic light emitting layer 500, the second electrode 400, the buffer layer not shown and the light scattering layer 800, so that the vacant space 700 can be formed between the light scattering layer 800 and the liquid crystal display panel 2000.

Inert gas such as nitrogen gas may be contained in the vacant space 700. In this case, the surface of the light scattering layer 800 may be formed into an uneven shape or a minute-lens array shape so that the amount of taken-out light is increased. Further, if necessary, a moisture absorbent may be disposed between the liquid crystal display panel 2000 and the metal substrate 100 so that light emitted from the organic light emitting layer 500 is not disturbed or a transparent moisture-absorbent film may be applied on the side of the light scattering layer 800 of the polarizing plate 2005.

Light from the light emitting device passes through the polarizing plate 2005 and then passes through the liquid crystal layer 2003 to come into the polarizing plate 2004. In this case, a voltage corresponding to image information supplied from an image information generator (not shown) is applied between the common electrode and the pixel electrode to thereby control a polarization state of light passing through the liquid crystal layer 2003 and adjust the amount of light passing through the polarizing plate 2004, so that desired image light can be formed.

Further, when there is no vacant space 700 between the light scattering layer 800 and the liquid crystal display panel 2000 and the light scattering layer 800 is in direct contact with the liquid crystal display panel 2000, part of light which is emitted from the organic light emitting layer 500 and passes through the light scattering layer 800 to come into the liquid crystal display panel 2000 is transmitted within the substrate constituting the liquid crystal display panel. The light transmitted within the liquid crystal display panel changes its transmission direction by a structure such as wiring constituting the liquid crystal display panel and is emitted outside from an unintended area, so that the image quality is deteriorated. Alternatively, the light transmitted within the liquid crystal display panel is absorbed by the member constituting the liquid crystal display panel to suffer a loss.

On the other hand, as in the embodiment, when the vacant space 700 is disposed between the light scattering layer 800 and the liquid crystal display panel 2000, the light emitted from the organic light emitting layer 500 and passing through the light scattering layer 800 is hardly transmitted within the liquid crystal display panel, so that the light is not emitted outside from an unintended area and the image quality is not deteriorated. Further, since the light transmitted within the liquid crystal display panel to suffer a loss is hardly produced, the brighter image can be obtained. Moreover, since constituent members are reduced by using the transparent substrate of the liquid crystal display panel as the sealing plate for preventing deterioration of the light emitting device, the thinner and lighter display device can be realized.

Embodiment 8

Figure 12:
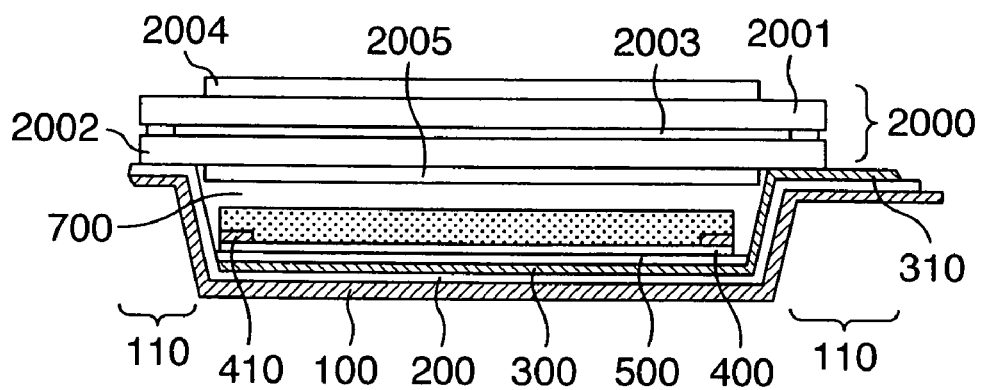
FIG. 12 is a sectional view illustrating a display device according to an eighth embodiment of the present invention.

Another embodiment of the display device according to the present invention is now described. FIG. 12 is a partially sectional view illustrating the display device of the present invention. The display device is different from the lighting device described with reference to FIG. 11 in that the spacer is removed and instead a convex area 110 is formed at the periphery portion of the metal substrate 100 so that the convex area 110 is bonded to the liquid crystal display panel 2000. Accordingly, the like portions or elements to those of the preceding embodiment are designated by like reference numerals and detailed description thereof is omitted.

In the embodiment, the metal substrate 100 includes the convex area 110 formed at the peripheral portion of the metal substrate on the side where the organic light emitting layer 500 is formed.

The second transparent substrate 2002 is hermetically bonded to the metal substrate 100 at the convex area 110 by means of adhesive sealing agent. A flat portion having a width of about 0.1 to 3.0 mm may be formed at the top of the convex area 110 in order to facilitate the bonding of the second transparent substrate 2002 to the metal substrate 100 and enhance the hermetically sealing characteristic.

In this case, when the polarizing plate 2005 exists between the convex area 110 of the metal substrate 100 and the second transparent substrate 2002, there is the possibility that moisture and oxygen in the air enter into the organic light emitting layer 500 through the polarizing plate to thereby cause deterioration. Accordingly, as shown in FIG. 12, it is preferable that the convex area 110 is formed outside of the polarizing plate 2005 so that the polarizing plate 2005 is not disposed between the convex area 110 and the second transparent plate 2002.

In this case, the height or thickness of the convex area 110 is made thicker than the total thickness of the first electrode 300, the organic light emitting layer 500, the second electrode 400, the buffer layer not shown, the light scattering layer 800 and the polarizing plate 2005, so that the vacant space 700 is formed between the light scattering layer 800 and the liquid crystal display panel 2000.

Alternatively, the surface of the polarizing plate may be subjected to the gas barrier processing. In this case, if the polarizing plate 2005 is disposed between the convex area 110 and the second transparent substrate 2002, the height or thickness of the convex area 110 is made thicker than the total thickness of the first electrode 300, the organic light emitting layer 500, the second electrode 400, the buffer layer not shown and the light scattering layer 800, so that the vacant space 700 is formed between the light scattering layer 800 and the liquid crystal display panel 2000.

In the case of the metal substrate, such a convex area can be formed easily by pressing a plate-shaped metal sheet.

Even in the embodiment, since the vacant space 700 is formed between the light scattering layer 800 and the liquid crystal display panel 2000, light which is emitted from the organic light emitting layer 500 and passes through the light scattering layer 800 is not transmitted within the liquid crystal display panel 2000, so that the light is not emitted outside from an unintended area and the image quality is not deteriorated. Further, light transmitted within the sealing plate 900 to suffer a loss is hardly produced and accordingly the brighter image can be obtained. Moreover, since constituent members are reduced by using the transparent substrate of the liquid crystal display panel as the sealing plate for preventing deterioration of the light emitting device, the thinner and lighter display device can be realized.

In the embodiment, by functioning the convex area 110 formed on the metal substrate as the spacer, it is not necessary to dispose the spacer member separately. That is, since the sealing plate and the spacer can be removed, the more inexpensive light emitting device can be realized.

Embodiment 9

Another embodiment of the light emitting device according to the present invention is now described.

Figure 13:
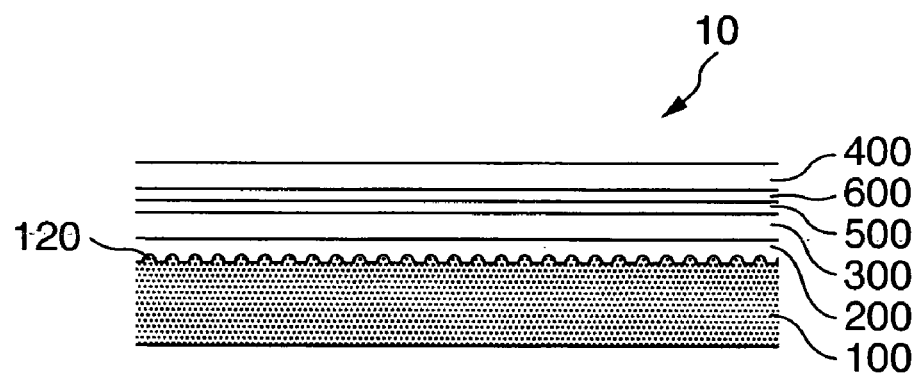
FIG. 13 is a sectional view illustrating a light emitting device according to a ninth embodiment of the present invention.

FIG. 13 is a partially sectional view illustrating the light emitting device of the present invention. The light emitting device is different from the light emitting device described with reference to FIG. 1 in that the first electrode 300 is made of transparent electrode material and a minute uneven portion is formed on the surface of the metal substrate 100. Accordingly, the like portions or elements to those of the preceding embodiment are designated by like reference numerals and detailed description thereof is omitted.

In the embodiment, the surface of the metal substrate 100 is formed with the minute uneven portion 120 and is formed into a scatteringly reflecting plane for scatteringly reflecting visible light. The height and the pitch of the uneven portion 120 are of the order of submicron to micron, concretely about 0.5 to 5 μm, and the uneven portion can be formed into an irregular pattern to thereby realize the scatteringly reflecting plane.

Such a shape of the surface of the metal substrate can be formed easily by sandblast, press work or the like.

The insulating layer 200 is formed into a laminated structure of an insulating layer made of inorganic material and an insulating layer made of organic insulating material having the excellent smoothing function in order to prevent the uneven shape of the metal substrate from influencing the organic light emitting layer 500.

In this case, about a half of light emitted from the organic light emitting layer and taken out to the outside is reflected by the surface of the metal substrate. At this time, since the light is scatteringly reflected by the surface of the metal substrate to thereby cancel influence of interference, the light emitting layer in which change in brightness and color due to difference of the angle of the visual field is reduced can be realized.

Embodiment 10

Figure 14:
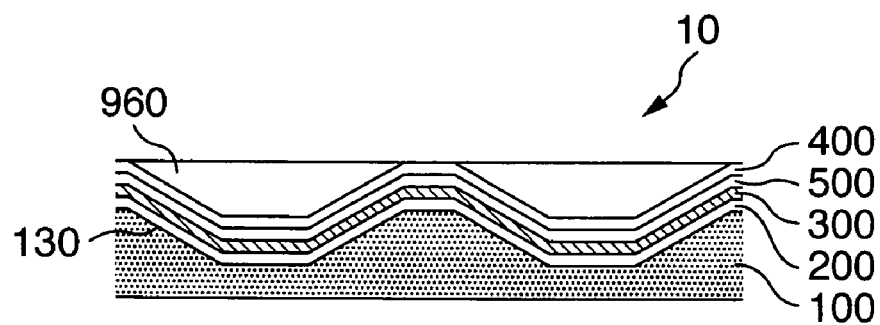
FIG. 14 is a sectional view illustrating a light emitting device according to a tenth embodiment of the present invention.

Another embodiment of the light emitting device according to the present invention is now described. FIG. 14 is a partially sectional view illustrating the light emitting device of the present invention. The light emitting layer is different from the light emitting device described with reference to FIG. 1 in that the surface of the metal substrate is formed into an uneven shape and the insulating layer 200, the first electrode 300, the organic light emitting layer 500 and the second electrode 400 are formed in the corresponding manner to the uneven shape. Accordingly, the like portions or elements to those of the preceding embodiment are designated by like reference numerals and detailed description thereof is omitted.

In the embodiment, the surface of the metal substrate 100 is formed into a trapezoid or hemispherical uneven portion 130 by press work or the like. The height or amplitude of the uneven portion is 5 to several tens μm.

The insulating layer 200 for smoothing minute projections on the surface of the metal substrate causing faults such as short circuits and maintaining the uneven shape of the surface of the substrate formed with intention is formed on the surface of the metal substrate. Such an insulating layer can be formed to be pinhole-free by the electrophoretic painting method (electrodeposition painting), the spray painting method or the like. In this case, acryl resin, urethane resin or epoxy resin (paint) can be used as material of the insulating layer. Further, if necessary, nitride such as SiN and AlN or oxide such as $SiO_2$ and $Al_2O_3$ may be piled to form a lamination as the insulating layer.

Since the thickness of the first electrode 300, the organic light emitting layer 500 and the second electrode 400 formed on the insulating layer 200 is as thin as several hundreds nm, the shape of the surface of the metal substrate is maintained.

A transparent transmissive layer 960 may be disposed in depressed portion of the surface of the metal substrate, that is, in depressed portion on the second electrode 400 if necessary. The transmissive layer 960 may be made of transparent organic material, for example, acryl resin, urethane resin or epoxy resin.

In the embodiment, since the area of the surface of the metal substrate is increased by the uneven portion formed thereon, the effective light emitting area is increased. Accordingly, the brighter light emitting device can be realized.

Further, in the embodiment, light transmitted in the direction of the substrate surface to suffer a loss heretofore is partially reflected by the inclined portions of the first electrode 300 to be taken out to the outside by disposing the transparent transmissive layer 960 in the depressed portion and accordingly the light emitting device having the higher light out-coupling efficiency can be attained.

Embodiment 11

Figure 15:
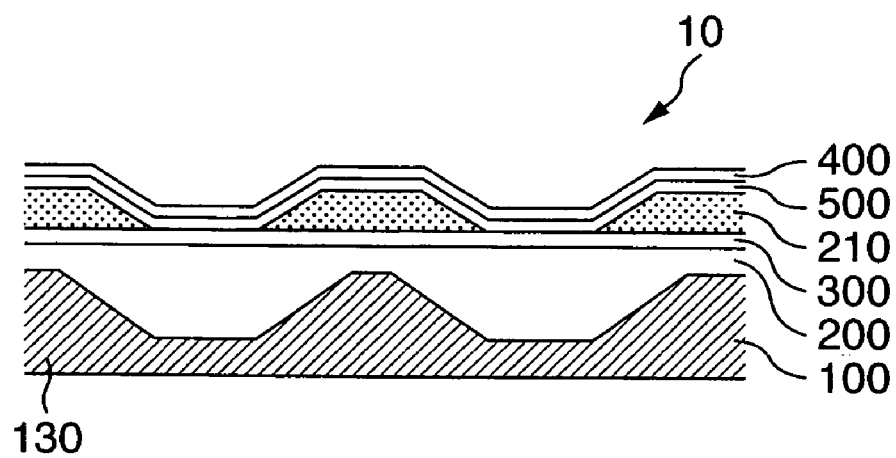
FIG. 15 is a sectional view illustrating a light emitting device according to an eleventh embodiment of the present invention.

Another embodiment of the light emitting device according to the present invention is now described. FIG. 15 is a partially sectional view illustrating the light emitting device of the present invention. The light emitting device is formed by deforming the light emitting device described with reference to FIG. 1. Accordingly, the like portions or elements to those of the preceding embodiment are designated by like reference numerals and detailed description thereof is omitted.

The light emitting device includes a trapezoid or hemispherical uneven portion 130 formed on the surface of the metal substrate and having the height or amplitude of 1 to several tens μm. The uneven portion 130 is smoothed or flattened by the transparent insulating layer 200 and the first electrode 300 made of transparent electrode material is formed on the flattened portion.

The insulating layer having the excellent smoothing or flattening function may be made of organic material such as transparent acryl resin, benzocyclobutene resin and polyimide resin. The organic material is used to form the layer by means of the spin coating method or the like, so that the surface thereof can be flattened relatively easily.

An insulating layer 210 having a plurality of openings is selectively formed on the first electrode 300, and the organic light emitting layer 500 and the second electrode 400 made of transparent electrode material are disposed or piled on the insulating layer 210 in order of the description.

The openings of the insulating layer 210 each have the centers that are substantially aligned with the centers of depressed portions of the uneven portion of the surface of the metal substrate 100 as observed from the front of the device.

The insulating layer 210 can be formed by patterning photopolymer by the photolithography method.

In the embodiment, when a voltage is applied between the first and second electrodes to conduct a current, only the areas corresponding to the openings of the insulating layer 210 emit light. In this case, since light emitted from the organic light emitting layer 500 and transmitted in the direction parallel to the substrate surface to suffer a loss heretofore is partially reflected by the inclined surfaces of the metal substrate 100 to be taken out to the outside, the light emitting device having the higher light emission efficiency can be attained.

In the embodiment, when the openings of the insulating layer 210 are made small, the light emitting areas are reduced. Accordingly, if the uneven shape or Portion of the surface of the metal substrate is part of an ellipsoid of revolution having a focal point positioned approximately in the light emitting area, light emitted from the light emitting area and reflected by the surface of the metal substrate is substantially parallel to the direction perpendicular to the substrate surface and is taken out to the outside. Accordingly, the light emitting device having the high light out-coupling efficiency and large gain can be realized.

Embodiment 12

Figure 16:
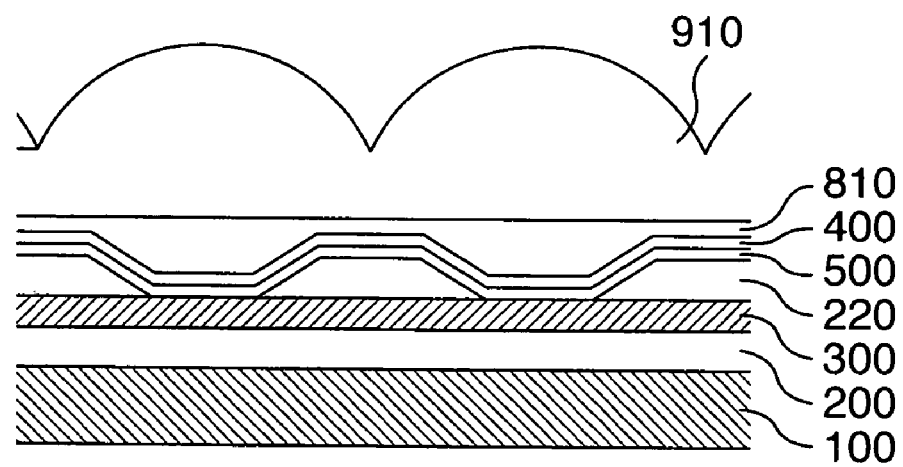
FIG. 16 is a sectional view illustrating a light emitting device according to a twelfth embodiment of the present invention.

Another embodiment of the light emitting device according to the present invention is now described. FIG. 16 is a partially sectional view illustrating the light emitting device of the present invention. The light emitting device is formed by deforming the light emitting device described with reference to FIG. 1. Accordingly, the like portions or elements to those of the preceding embodiment are designated by like reference numerals and detailed description thereof is omitted.

The light emitting device includes the first electrode 300 of reflective metal material formed on the insulating layer 200 formed on the metal substrate 100 and an insulating layer 220 formed on the first electrode and having a plurality of openings formed selectively therein. The openings of the insulating layer 220 can be formed by using photopolymer as an insulating layer and patterning the photopolymer by the photolithography method.

Further, the organic light emitting layer 500 and the second electrode 400 made of transparent electrode material are disposed or piled on the insulating layer 220.

A microlens array 910 is disposed on the second electrode 400 through a transparent layer 810. In this case, the transparent layer 810 is made of material satisfying the condition that the refractive index of the transparent layer 810 is equal to that of the second electrode 400 or the microlens array 910 or equal to an intermediate value between the second electrode 400 and the microlens array 910. Such a transparent layer 810 may be made of transparent adhesive acrylic material.

The microlens array 910 may be formed by means of the known technique such as, for example, the method of transferring a shape of stamper to transparent resin, the injection molding method, the method of forming microlenses made of photoresist on a substrate by the photolithography and the method of forming a pattern made of photoresist on glass and etching it to form microlenses.

The microlens array 910 is disposed so that the centers of the lenses thereof are aligned with the openings of the insulating layer 220 as observed from the front of the device. In order to realize the higher light out-coupling efficiency, it is preferable that the microlens array 910 is disposed so that the centers of the lenses thereof are substantially aligned with the centers of the openings of the insulating layer 220 as observed from the front of the device.

In the embodiment, when a voltage is applied between the first and second electrodes 300 and 400 to conduct a current, only the areas corresponding to the openings of the insulating layer 220 emit light. In this case, since light emitted from the organic light emitting layer 500 and transmitted in the direction of the substrate surface to suffer a loss is partially refracted by the surface of the microlenses to be taken out in the front direction, the light emitting device having the higher light out-coupling efficiency is obtained.

Further, in the embodiment, when the openings of the insulating layer 220 are made small, the light emitting area is reduced. Accordingly, the focal points of lenses of the microlens array 910 are set to substantially coincide with the organic light emitting layer corresponding to the openings of the insulating layer 220, so that light emitted from the organic light emitting layer is substantially parallel to the direction perpendicular to the substrate surface and is taken out to the outside. Accordingly, the light emitting device having the high light out-coupling efficiency and large gain can be realized.

Embodiment 13

Figure 17:
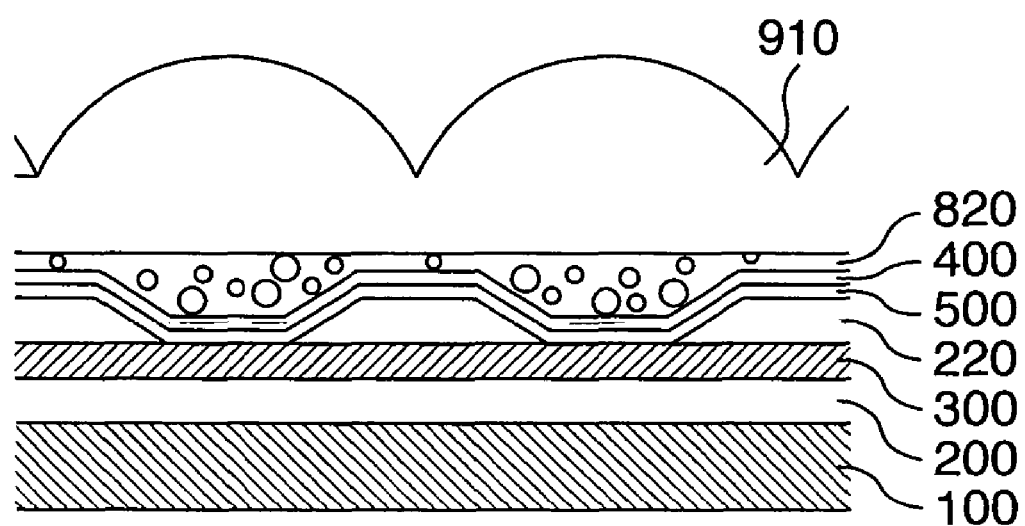
FIG. 17 is a sectional view illustrating a light emitting device according to a thirteenth embodiment of the present invention.

Another embodiment of the light emitting device according to the present invention is now described. FIG. 17 is a partially sectional view illustrating the light emitting device of the present invention. The light emitting device is different from the light emitting device described with reference to FIG. 16 in that the transparent layer disposed between the second electrode 400 and the microlens array 910 is replaced by a light scattering layer 820 and other structure except the light scatter layer 820 is the same as that of the preceding embodiment. Accordingly, the like portions or elements as those of the preceding embodiment are designated by like reference numerals and detailed description thereof is omitted.

The light scattering layer 820 may use the same as that described in the embodiment 3. Particularly, when the light scattering layer using transparent adhesive agent of acryl is used as the transparent medium, the microlens array 910 and the substrate 100 can be fixed to each other and accordingly it is preferably unnecessary to use other fixing members.

In the embodiment, the light scattering layer 820 is disposed between the second electrode 400 and the microlens array 910 to thereby suppress coloring due to influence of interference and the light emitting device having the higher light out-coupling efficiency can be realized.

The light emitting device of the present invention can realize a thin plate-like or sheet-like light source having high efficiency and long life and accordingly is suitable for backlight of the lighting device and the liquid crystal display device.

Further, since the display device of the present invention is thin and highly efficient, it is suitable for the display device of portable apparatuses such as portable telephones, personal digital assistants (PDA) and notebook size personal computers.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A light emitting device including an organic light emitting layer disposed on a substrate and first and second electrodes between which said organic light emitting layer is disposed on said substrate, comprising:
said first electrode formed on the side of said substrate of said organic light emitting layer;
said second electrode being formed on the opposite side to said substrate of said organic light emitting layer;
a buffer layer disposed between said second electrode and said organic light emitting layer and mainly made of oxide having a smaller quantity of oxygen generated in decomposition upon formation of said buffer layer than that of oxygen generated in decomposition upon formation of said second electrode; and
a light scattering layer disposed on a light out-coupling side of said light emitting layer and having an average refractive index smaller than a refractive index of said light emitting layer, said second electrode layer, and said buffer layer,
said substrate being made of metal,
wherein a refractive index of said light emitting layer is not less than 1.7, and
wherein the average refractive index of the light scattering layer is smaller than 1.5.

2. A light emitting device according to claim 1, wherein: said second electrode is made of oxide containing indium oxide as main material, and said buffer layer is made of material containing vanadium oxide as main component.

3. A light emitting device according to claim 1, wherein: said buffer layer is mainly made of material having generated Gibbs energy near a melting point smaller than −300 KJ/mol.

4. A light emitting device according to claim 1, further comprising: an auxiliary electrode disposed on said second electrode and having an electric resistance smaller than that of said second electrode.

5. A light emitting device according to claim 1, wherein: said light scattering layer includes a medium transparent to visible light and transparent substances contained in said transparent medium and made of transparent particles or bubbles having a refractive index different from that of said medium.

6. A light emitting device according to claim 1, wherein: said light scattering layer is disposed or piled on said second electrode through a protection layer.

7. A lighting device comprising a light emitting device according to claim 1, wherein: said second electrode is transmissible to visible light; a convex portion is formed on the side where said organic light emitting layer is formed, of said substrate at periphery of an area where said organic light emitting layer is formed; and said metal substrate is bonded to a transparent sealing member at said convex portion.

8. A lighting device according to claim 7, wherein:
the height of said convex portion of said metal substrate being larger than a total thickness of said light emitting layer, said first electrode, said second electrode and said light scattering layer.

9. A display device including a display panel for forming image by controlling a transmission factor of light coming from at least the back thereof and a light emitting device according to claim 1 disposed at the back of said display panel, wherein: said display panel includes a transparent substrate having the light transmission characteristic, said second electrode is transmissible to visible light and formed on light out-coupling side corresponding to the opposite side to said substrate of said light emitting layer, and said substrate on which said light emitting layer is formed is bonded to said transparent substrate of said display panel so that vacant space is formed between said light scattering layer and said transparent substrate of said display panel.

10. A display device according to claim 9, wherein: a convex portion is formed on the side where said organic light emitting layer is formed, of said substrate at periphery of an area where said organic light emitting layer is formed, and said metal substrate is bonded to said transparent substrate of said display panel at said convex portion.

11. A light emitting device according to claim 1, further comprising: an uneven portion having height of 0.5 to 5 μm and formed on the surface of said substrate.

12. A light emitting device according to claim 1, further comprising: an uneven portion formed on the surface of said substrate; and an insulating film formed into laminated structure of an insulating layer made of organic material and an insulating layer made of inorganic material and disposed between said first electrode and said substrate.

13. A light emitting device according to claim 12, wherein: said insulating layer, said first electrode, said organic light emitting layer and said second electrode are formed in a corresponding manner to the uneven shape of the surface of said substrate.

14. A light emitting device according to claim 12, further comprising: an insulating layer having a plurality of openings and formed between said first electrode and said organic light emitting layer, and wherein said openings of said insulating layer are formed in a corresponding manner to depressed portions of the surface of said substrate.

15. A light emitting device according to claim 1, further comprising: an insulating layer having a plurality of openings, said organic light emitting layer and said second electrode being formed into laminated structure on said substrate, and a microlens array formed on said second electrode and having the centers of lenses thereof aligned with said openings of said insulating layer as observed from the front of said device.

16. A light emitting device according to claim 15, further comprising: a transparent layer disposed between said second electrode and said microlens array and having a refractive index equal to that of said second electrode or said microlens array or equal to an intermediate value between said second electrode and said microlens array.

17. A light emitting layer according to claim 1, wherein a thickness of the light scattering layer is greater than 20 μm and less than 100 μm.

18. A light emitting device including an organic light emitting layer disposed on a substrate and first and second electrodes between which said organic light emitting layer is disposed on said substrate, comprising: said first electrode formed on the side of said substrate of said organic light emitting layer;
said second electrode being formed on the opposite side to said substrate of said organic light emitting layer; a buffer layer disposed between said second electrode and said organic light emitting layer and mainly made of oxide having a smaller quantity of oxygen generated in decomposition upon formation of said buffer layer than that of oxygen generated in decomposition upon formation of said second electrode; and a light scattering layer disposed on a light out-coupling side of said light emitting layer and having an average refractive index smaller than a refractive index of said light emitting layer, said second electrode layer, and said buffer, said substrate being made of metal, wherein a refractive index of said light emitting layer is not less than 1.7, and wherein the average refractive index of the light scattering layer is smaller than 1.5, said light emitting device further comprising: an uneven portion formed on the surface of said substrate; an insulating film formed between said substrate and said first electrode; and an uneven portion formed on a surface of said insulating film at a side adjacent to said substrate.

* * * * *